United States Patent
Demange

(10) Patent No.: US 11,432,427 B2
(45) Date of Patent: Aug. 30, 2022

(54) COMPUTER CABINET COMPRISING DEVICES FOR INTERCONNECTING INTERCONNECTION SWITCHES AND RACKABLE ELEMENTS

(71) Applicant: BULL SAS, Les Clayes-sous-Bois (FR)

(72) Inventor: Fabien Demange, Poissy (FR)

(73) Assignee: BULL SAS, Les Clayes-sous-Bois (FR)

( * ) Notice: Subject to any disclaimer, the term of this patent is extended or adjusted under 35 U.S.C. 154(b) by 202 days.

(21) Appl. No.: 16/839,567

(22) Filed: Apr. 3, 2020

(65) Prior Publication Data

US 2020/0323097 A1 Oct. 8, 2020

(30) Foreign Application Priority Data

Apr. 4, 2019 (FR) ...................... 1903607

(51) Int. Cl.
*H05K 7/14* (2006.01)
*G06F 1/18* (2006.01)
*H04Q 1/02* (2006.01)

(52) U.S. Cl.
CPC ........... *H05K 7/1492* (2013.01); *G06F 1/181* (2013.01); *H04Q 1/09* (2013.01); *H05K 7/1491* (2013.01)

(58) Field of Classification Search
CPC .... H05K 7/1492; H05K 7/1491; G06F 1/181; H04Q 1/09
See application file for complete search history.

(56) References Cited

U.S. PATENT DOCUMENTS 11,200,104 B2 * 12/2021 Adiletta ............... H05K 7/1487
2017/0257970 A1 9/2017 Alleman et al.
2018/0295737 A1 10/2018 Balasubramananian et al.

OTHER PUBLICATIONS

Search Report as issued in French Patent Application No. 1903607, dated Feb. 12, 2020.
León, E. A., et al., "Characterizing Parallel Scientific Applications on Commodity Clusters: An Empirical Study of a Tapered Fat-Tree," Proceedings of the International Conference for High Performance Computing, Networking, Storage and Analysis, SC '16, pp. 78:1-78:12, Piscataway, NJ, USA, (2016), IEEE Press.

* cited by examiner

*Primary Examiner* — James Wu
*Assistant Examiner* — Hung Q Dang
(74) *Attorney, Agent, or Firm* — Arc IP Law, PC; Joseph J. Mayo

(57) ABSTRACT

A modular computer cabinet include an interchangeable interconnection device configured to interconnect the interconnection switch with the rackable element, the interchangeable interconnection device including a wall for connecting to a rackable element, the connection wall extending along a second plane orthogonal to the first plane of the rackable element, the connection wall including a third blindly connectable connector configured to be blindly connected to the first blindly connectable connector included in the rackable element, a cable connected to the third connector of the connection wall, the interconnection cable including a fourth connector configured to be connected to the second connector of the plurality of second connectors included in the interconnection switch.

9 Claims, 4 Drawing Sheets

Prior Art

COMPUTER CABINET COMPRISING DEVICES FOR INTERCONNECTING INTERCONNECTION SWITCHES AND RACKABLE ELEMENTS

CROSS-REFERENCE TO RELATED APPLICATIONS

This application claims priority to French Patent Application No. 1903607, filed Apr. 4, 2019, the entire content of which is incorporated herein by reference in its entirety.

TECHNICAL FIELD OF THE INVENTION

The invention relates to a device for interconnecting interconnection switches and compute nodes.

The technical field of the invention is that of computer cabinets configured to comprise at least interconnection switches and compute blades, that is to say interconnection and computing elements having a so-called "rackable" or "rack mountable" format.

The field of the invention is further that of high performance computers.

The field of the invention is further that of computing centres and data centres.

TECHNOLOGICAL BACKGROUND OF THE INVENTION

Computer cabinets of the prior art comprise a frame making it possible to accommodate rackable elements, of which interconnection switches. In the case of distributed computing, for example of an application of the computer cabinet to High Performance Computing (HPC), the interconnection switches make it possible to interconnect compute nodes comprised in compute blades. These compute blades are elements that can be mounted in the frame of the computer cabinet. The interconnection of compute nodes makes it possible to distribute computations over several nodes.

FIG. 1 schematically represents a front view of a cabinet 100 of the prior art.

A computer cabinet 100 of the prior art may for example comprise a frame 110, a Power Distribution Unit (PDU) 120, a Power Supply Unit (PSU) 130, a plurality of interconnection switches 140, a plurality of rackable elements 150 and a cooling unit 160.

The computer cabinet 100 represented in FIG. 1 may comprise a frame 110 respecting for example the 19 inch standard. The total width of the sub-rack of the frame of computer cabinets 100 of the prior art is 482.6 mm, that is to say 19 inches, including mounting brackets. This width is at the origin of the 19 inch mounting system. Thus, the width of the elements accommodated by the frame of computer cabinets 100 of the prior art respects this 19 inch standard. Hereafter, when a rackable element "respecting the 19 inch standard" is mentioned, reference will be made to an element having a facade width making it possible to be mounted in the frame in a computer cabinet of 19 inches, that is to say for example of which the facade width is 19 inches or of which the facade width is less than 19 inches.

The computer cabinet 100 comprises for example a plurality of interconnection switches 140, each interconnection switch of the plurality of interconnection switches 140 being able for example to have a height of 1 U. In a 19 inch computer cabinet 100, the spacing between the rackable elements is normally a multiple of a length called the "rack unit" (abbreviation "U") and which measures 1.75 inches, i.e. 44.45 millimetres.

The height of a front facade of a rackable item of equipment is not exactly a whole multiple of U because, to enable easy mounting of adjacent items of equipment, a space of ⅟₃₂ inch, i.e. 0.031 inch, i.e. 0.79 mm, is left between each facade. Thus, an element having a facade of 1 U will have a height of 1.719 inches, i.e. 43.66 millimetres. Hereafter, when a "1 U" rackable element is mentioned, reference will be made to an element having a facade height making it possible to respect the spacing of a rack unit (1 U), that is to say for example of which the facade height is 1.719 inches.

The computer cabinet 100 further comprises a plurality of rackable elements 150, each rackable element of the plurality of rackable elements 150 being able for example to have a height of 1 U.

The rackable elements 150 may for example be compute blades. These compute blades may for example respect the 19 inch standard and be 1 U blades. These compute blades generally comprise several compute nodes, for example three. A compute node of the prior art comprises a plurality of processors, for example two processors, and a plurality of memory sticks, for example eight memory sticks per processor, that is to say in the present case sixteen memory sticks. Each processor of each compute node makes it possible to execute computational instructions.

In the case of high performance computing, these computational instructions are generally received by the compute blade 150 via an interconnection network. This interconnection network comprises interconnection switches 140, being network nodes. Thus, the computational instructions may be distributed between the compute nodes to perform distributed computing.

In order for a cabinet 100 forming part of a high performance computing device to be operational, it is necessary that the compute nodes can receive computational instructions and transmit their results, and that they can communicate with each other, and thus it is necessary that:

The compute nodes are connected to interconnection switches;

The interconnection switches are connected to each other.

The interconnection switches of the plurality of interconnection switches 140 connected to the compute blades 150 of the interconnection switches are called "L1" (Level 1). An interconnection switch 140 may be referred to simply by the term "switch".

The interconnection switches L1 are connected to "L2" (Level 2) interconnection switches. These L2 interconnection switches are connected to other L2 interconnection switches.

The number of connections varies as a function of the chosen network topology. Among known topologies may be cited at least: blocking fat tree, non-blocking fat tree, 3d tore, hypercube. This list is not limiting. Thus, in certain topologies, there may be two levels or even three levels of interconnection switches.

Whatever the topology, it is necessary to establish physical intra-cabinet connections between at least one L1 interconnection switch 140 of a cabinet 100 and at least one compute blade 150 of the same cabinet 100.

Within a computer cabinet, to connect two items of equipment, optical cables or copper cables are commonly used. For rapid buses, the speed of which is greater than 40 Gigabits per second, which use links at 10 Gigabits per second, at 25 Gigabits per second or at 56 Gigabits per second, PAM (Pulse Amplitude Modulation) modulated, the format overwhelmingly used is the QSFP (Quad Small Form-Factor Pluggable) format. QSFP is a compact and hot pluggable transmitter-receiver.

Thus, cables, copper or optical, with QSFP connectors are commonly used to connect the compute blades 150 of a computer cabinet 100 to the L1 interconnection switches 140.

In the prior art, a computer cabinet 100 may be delivered with a fixed "pre-cabled" topology, enabling simple and rapid use: it suffices to mount compute blades 150 in the frame 110 of the cabinet 100, while connecting them to pre-installed connectors already connected to interconnection switches 140, for example QSFP connectors.

FIG. 2 represents a side view of a pre-cabled cabinet 100 of the prior art.

FIG. 2 shows, according to a side view, a cabinet 100 comprising on its facade a plurality of compute blades 150 connected to a cable box 180. The cabinet 100 also comprises on its rear face a plurality of compute blades 150, as well as a plurality of interconnection switches 140. The elements on the rear face are also connected to the cable box 180. The front face of the computer cabinet 100 in FIG. 2 is represented by the arrow A, whereas the rear face is represented by the arrow B.

The computer cabinet comprises a single cable box 180 only enabling a fixed interconnection network topology, with a fixed number of connectors for compute blades 150 and a fixed number of connectors for interconnection switches 140.

The topology being chosen and fixed, there is no cabling to carry out. Indeed, the connectors of the cable box are blind connectors, making it possible not to have connections to make by hand and thus to have compute blades 150 on the front face and on the rear face of the computer cabinet 100.

These systems impose however a fixed topology and a fixed number of interconnection switches 140: it is necessary that each interconnection switch 141 provided is connected in order to be able to distribute the computation efficiently according to the topology chosen. When it is wished to use fewer interconnection switches 140, it is then necessary to review all the cabling to keep the same topology, and thus the manufacturer has to design a new cable box 180 accommodating fewer interconnection switches 140 while keeping the same topology. Similarly, to use fewer compute blades 150, it is necessary to design a new cable box 180. It is also necessary to design a new cable box 180 to use a new topology. From an industrial viewpoint, this does not enable any flexibility, either in the number of rackable items of equipment of the computer cabinet 100, or in the interconnection network topology used.

In addition, since the interconnection switches 140 are expensive, imposing a fixed topology and thus a fixed number of interconnection switches 140 makes a cabinet 100 of the prior art inaccessible to certain potential users, even if said users would not have need of all the computational capacity proposed.

In order to overcome this, certain computer cabinets 100 of the prior art are not delivered pre-cabled.

FIG. 3 represents a side view of a cabinet 100 of the prior art not comprising a cable box.

A non pre-cabled cabinet 100 of the prior art comprises for example on the front face a plurality of interconnection switches 140 and a plurality of compute blades 150. The front face of the computer cabinet 100 in FIG. 3 is represented by the arrow A, whereas the rear face is represented by the arrow B.

With a non pre-cabled computer cabinet 100, it is incumbent on the operator to cable all of the items of equipment, compute blades 150 and interconnection switches 140, in order to create the desired topology. The operator then has to make an important number of connections between each cable and each item of equipment. The interconnections between items of equipment are usually made by copper cables or by optical cables, having at each end for example a QSFP connector. Each compute node of each compute blade 150 comprises a QSFP connector making it possible to address this compute node. Each interconnection switch 140 comprises a plurality of QSFP connectors.

A QSFP connector having 56.5 millimetres depth, and all of the items of equipment of the cabinet having to be interconnected by hand, it is necessary to have access to the rear face of the interconnection switches 140 and the compute blades 150 to interconnect them. It is thus not possible to have compute blades 150 on the rear face of the computer cabinet 100, because it is necessary to be able to access the connectors on the rear face of the compute blades 150 and the interconnection switches 140 which are situated on the front face of the computer cabinet 100, as represented in FIG. 3.

This implies a same bulk of the computer cabinet 100 for a number of compute blades 150 far fewer than the case of a pre-cabled computer cabinet 100.

There thus exists a need to have, within a computer cabinet 100, several possible topologies, and a flexible number of interconnection switches 140 and compute blades 150, while having compute blades 150 on the front face and on the rear face of the computer cabinet 100 and while limiting the number of connections to make by hand to interconnect all the items of equipment.

SUMMARY OF THE INVENTION

The invention offers a solution to the aforementioned problems, while making it possible to have, within a computer cabinet, a flexible number of rackable elements such as compute blades and interconnection switches, while enabling several possible topologies, while having compute blades on the front face and on the rear face of the computer cabinet and while only having to make connections by hand at the level of the interconnection switches.

An aspect of the invention thus relates to a modular computer cabinet configured to accommodate:
 A plurality of rackable elements, each rackable element extending along a first plane and comprising at least one first blindly connectable connector;
 At least one interconnection switch comprising a plurality of second connectors;
 The rackable elements and the interconnection switch being mounted on at least one frame of the computer cabinet, the mounting and the exploitation of these elements being done through a front face and/or through a rear face of the cabinet, the modular computer cabinet being characterised in that:
  the modular computer cabinet comprises at least one interchangeable interconnection device configured to interconnect the interconnection switch with the rackable elements, said interchangeable interconnection device comprising:
   a wall for connecting to the rackable elements, said connection wall extending along a second plane orthogonal to the first plane of the rackable elements, said connection wall comprising a plurality of third blindly connectable connectors, each blindly connectable connector being configured to be blindly connected to at least the first blindly connectable connector of one of the rackable elements, at least one cable connected to the third connector of the connection wall, said interconnection cable comprising at least one fourth connector configured to be connected to at least one second connector of the plurality of second connectors comprised in the interconnection switch, a box, the box comprising at least the connection wall.

Thanks to the invention, it is possible to change the interconnection network topology within a computer cabinet thanks to the fact that the interconnection device is interchangeable. In addition, the interchangeable interconnection device comprises a wall for connecting to a rackable element, for example a compute blade, comprising a blindly connectable connector. This blindly connectable connector makes it possible to be able to mount in the frame of the computer cabinet elements on the front face and on the rear face. Indeed, since the connector is blindly connectable, an operator does not need to have access to the rear face of the elements that it connects. This thus limits the number of connections that an operator has to make by hand.

This connector, blindly connectable to a rackable element, is connected to a cable, the cable further comprising a connector for connection with a connector of the interconnection switch. This cable implies among other things that an operator only has the connections of the cables to the switches to make, the other connector being comprised in a wall and being blindly connectable.

This cable enables flexibility, notably by the choice of the interconnection switch to which it may be connected and the connector in the interconnection switch, making it possible for example to modify in part the topology of the interconnection network. This cable may also make it possible to perform "pruning" on a topology, for example on a "fat-tree" topology, and to modify this pruning. Pruning is a technique which consists in eliminating certain links and interconnection switches. It has been shown that this technique does not significantly degrade the performance of the interconnection network in the document "Edgar A. León, Ian Karlin, Abhinav Bhatele, Steven H. Langer, Chris Chambreau, Louis H. Howell, Trent D'Hooge, and Matthew L. Leininger. Characterizing parallel scientific applications on commodity clusters: An empirical study of a tapered fat-tree. In Proceedings of the International Conference for High Performance Computing, Networking, Storage and Analysis, SC '16, pages 78:1-78:12, Piscataway, N.J., USA, 2016. IEEEPress".

Pruning makes it possible for example to save the energy consumed by the elements of the interconnection network. An advantage of the invention is thus to be able to modify this pruning easily.

Apart from the characteristics that have been mentioned in the preceding paragraph, the modular computer cabinet according to an aspect of the invention may have one or more complementary characteristics among the following, considered individually or according to all technically possible combinations thereof:

the interchangeable interconnection device is configured to be mounted substantially along a median plane separating the modular computer cabinet into two, the median plane being parallel to the front face of the modular computer cabinet.

the interchangeable interconnection device comprises at least one hole configured to allow the at least one cable to pass vertically.

at least one rackable element is a compute blade comprising a plurality of nodes and a same number of first connectors as compute nodes.

the modular computer cabinet comprises a plurality of interchangeable interconnection devices.

the modular computer cabinet comprises a plurality of rackable elements of which at least one rackable element mounted on the front face of the modular computer cabinet and at least one rackable element mounted on the rear face of the modular computer cabinet.

the modular computer cabinet comprises at least two interchangeable interconnection devices arranged back-to-back.

the at least one cable has a maximum data transfer rate of 20 Gigabits per second.

the at least one cable has a maximum data transfer rate of 40 Gigabits per second.

An advantage of having the interchangeable interconnection device along the median plane of the cabinet, that is to say at the centre of the cabinet, is that it makes it possible to have rackable elements on the front face and on the rear face of the modular computer cabinet. The fact that it is mounted along a plane parallel to the front face enables a space saving.

Advantageously, the modular computer cabinet may comprise several interchangeable interconnection devices, enabling more modularity and flexibility in the topologies chosen and easier modification of the pruning. It is also simpler to ramp up, that is to say to add rackable elements, by adding an additional interchangeable interconnection device. It is also easier to eliminate rackable elements, and to simply remove one or more interchangeable interconnection devices. This enables greater flexibility in the number of rackable elements and interconnection switches, while not having to make all the connections to interconnect the items of equipment by hand thanks to the connection wall and to the blindly connectable connectors.

The interconnection of the rackable elements on the front face and on the rear face of the cabinet is advantageously enabled thanks to the blindly connectable connectors of the connection wall of the interchangeable interconnection device and to the fact that two interchangeable interconnection devices are back-to-back.

When two interchangeable interconnection devices are back-to-back, it is advantageous that the interchangeable interconnection device is a box, making it possible not to have interaction between the cables of the two devices, and thus to be able to carry out maintenance of a box without risking unplugging or damaging one or more cables of another interchangeable interconnection device. It is also advantageous to have a hole making it possible to pass the cables vertically, notably if a second interchangeable interconnection device is situated under a first interchangeable interconnection device and if the interconnection switches are situated in the upper part of the modular computer cabinet. This makes it possible to pass the cables of the second interchangeable interconnection device in the hole of the first interchangeable interconnection device configured for this.

Advantageously, a same interchangeable interconnection device may interconnect several rackable elements to one or more interconnection switches.

Advantageously, the interchangeable interconnection device

The invention and its different applications will be better understood on reading the description that follows and by examining the figures that accompany it.

BRIEF DESCRIPTION OF THE FIGURES

The figures are presented for indicative purposes and in no way limit the invention.

DETAILED DESCRIPTION

The figures are presented for indicative purposes and in no way limit the invention.

Unless stated otherwise, a same element appearing in the different figures has a single reference.

Figure 1:
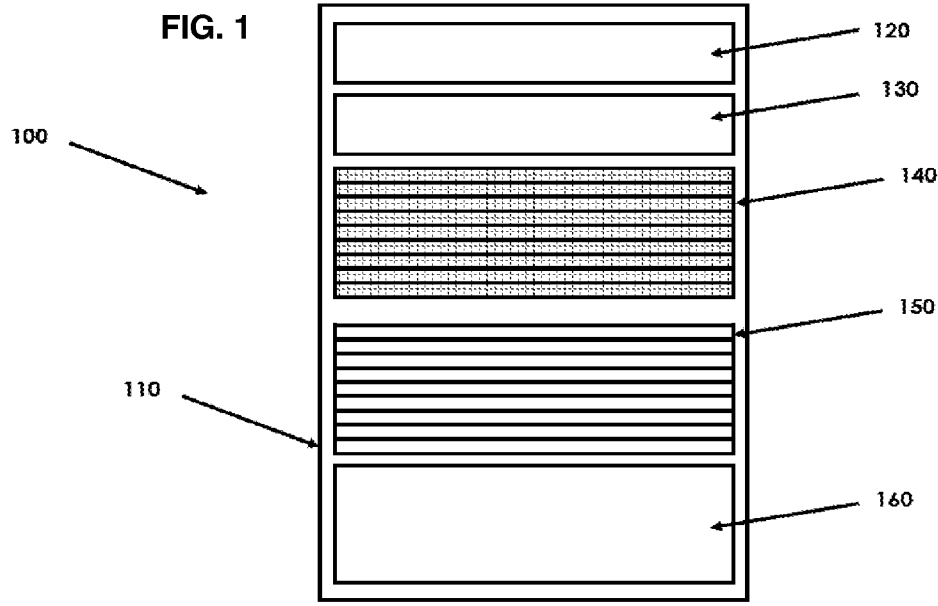
FIG. 1 schematically represents a front view of a cabinet of the prior art.
Figure 2:
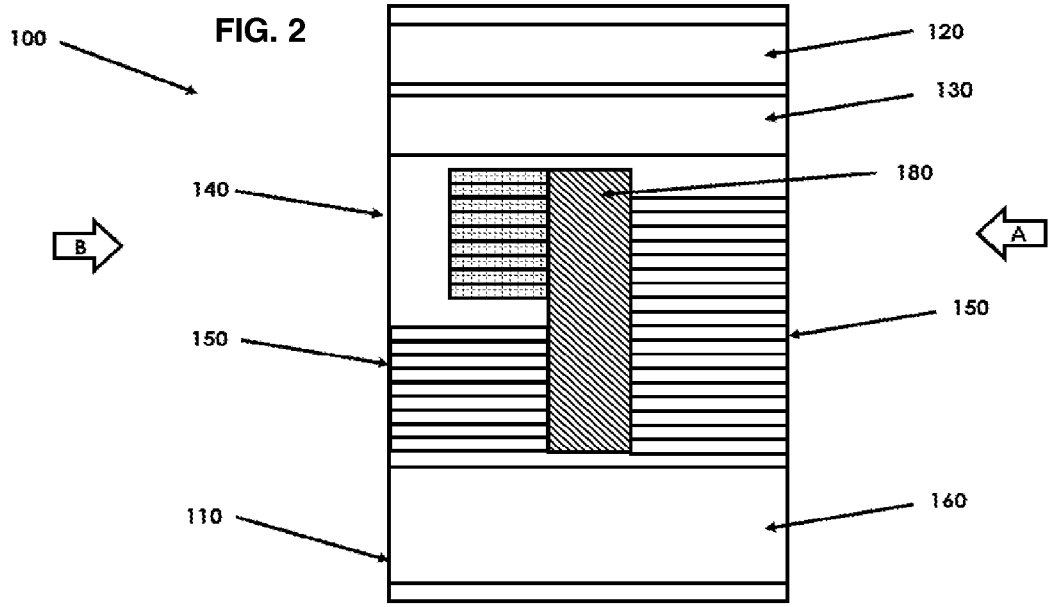
FIG. 2 represents a side view of a pre-cabled cabinet of the prior art.
Figure 3:
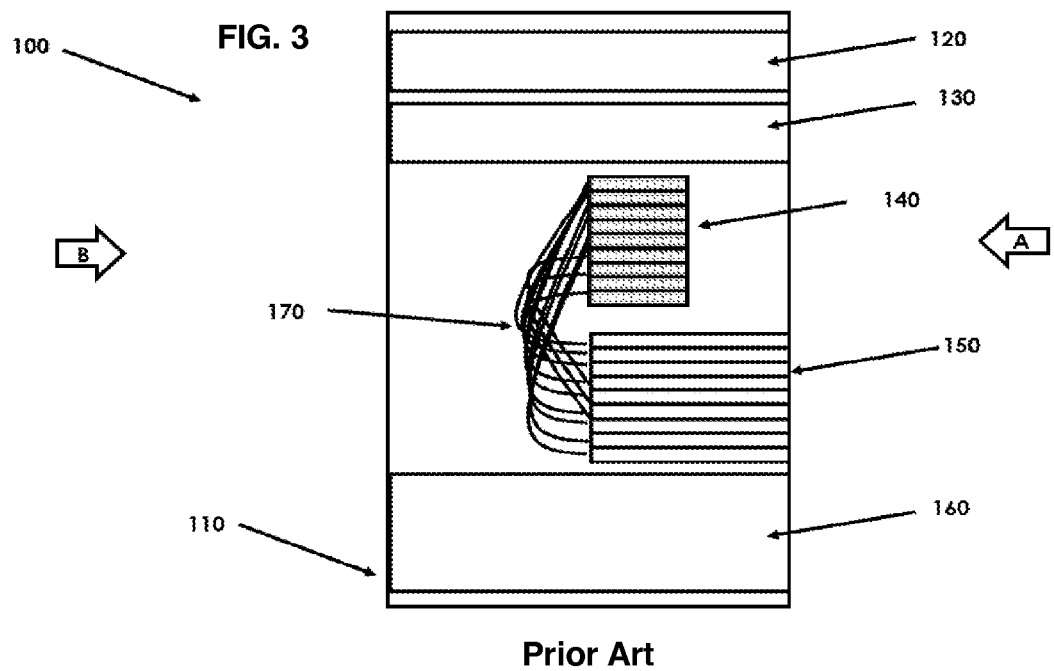
FIG. 3 represents a side view of a cabinet of the prior art not comprising a cable box.
Figure 4:
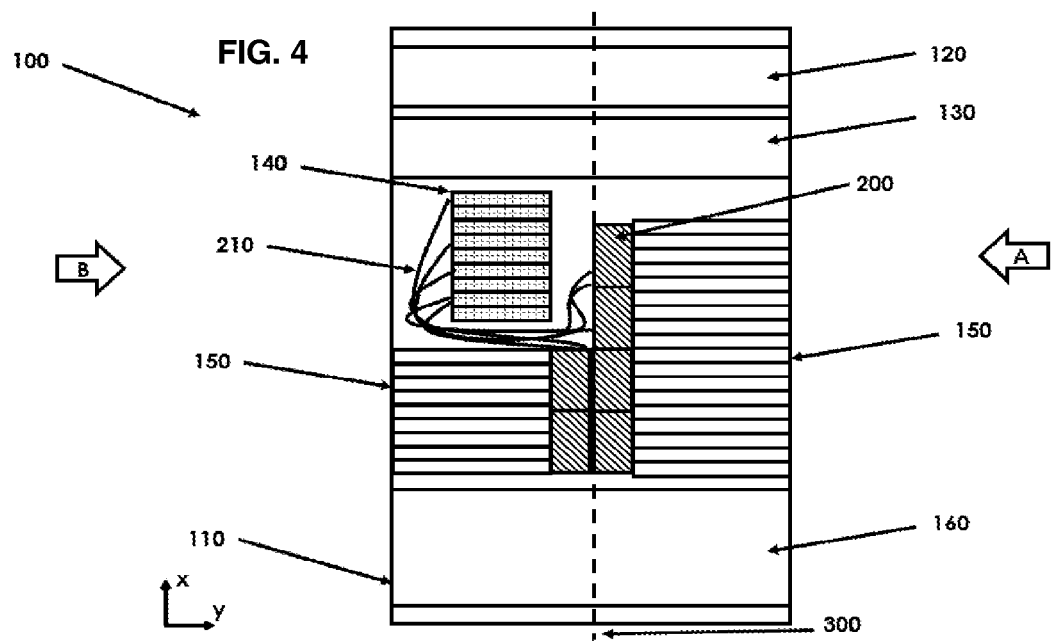
FIG. 4 represents a side view of a modular computer cabinet according to a first embodiment of the invention.

FIG. 4 represents a side view of a modular computer cabinet 100 according to a first embodiment of the invention.

The modular computer cabinet 100 according to a first embodiment of the invention is represented schematically in FIG. 4. The modular computer cabinet 100 comprises a frame 110, a power supply unit PSU 130, a power distribution unit PDU 120, a cooling unit 160, at least one interconnection switch 140, at least one rackable element 150 and at least one interchangeable interconnection device 200.

For example, in FIG. 4, the modular computer cabinet 100 comprises a plurality of interconnection switches 140, a plurality of rackable elements 150 on the front face of the modular computer cabinet 100 and a plurality of rackable elements 150 on the rear face of the modular computer cabinet 100. The front face of the modular computer cabinet 100 is the face visible when the modular computer cabinet 100 is looked at along arrow A in FIG. 4. The rear face of the modular computer cabinet 100 is the face visible when the modular computer cabinet 100 is looked at along arrow B in FIG. 4.

The rackable elements 150 may for example be compute blades. A compute blade comprises several processors, for example computing processors or graphic processors, and several memory sticks, each memory stick being managed by a processor, a processor managing several memory sticks. A set of several processors and several memory sticks managed by these processors is called a compute node. A rackable element 150 may for example be a 1 U compute blade respecting the 19 inch standard. A rackable element 150 is a frame mountable element, that is to say which is mounted on a rack inside a computer cabinet, either through the front face along arrow A or through the rear face along arrow B.

At least one rackable element among the rackable elements 150 may for example be a storage blade comprising at least one storage element, for example a hard disc or any other memory element, or any other rackable element 150.

The interconnection switches 140 are rackable elements, comprising a plurality of connectors. An interconnection switch may for example have a height of 1 U and a width making it possible to respect the 19 inch standard. For example, an interconnection switch 140 may comprise 48 connectors. These connectors may be QSFP, QSFP-DD, Ethernet connectors, or any other network connector.

The rackable elements 150 are interconnected with the interconnection switches 140 by interchangeable interconnection devices 200.

The interchangeable interconnection devices 200 comprise cables 210.

Figure 5:
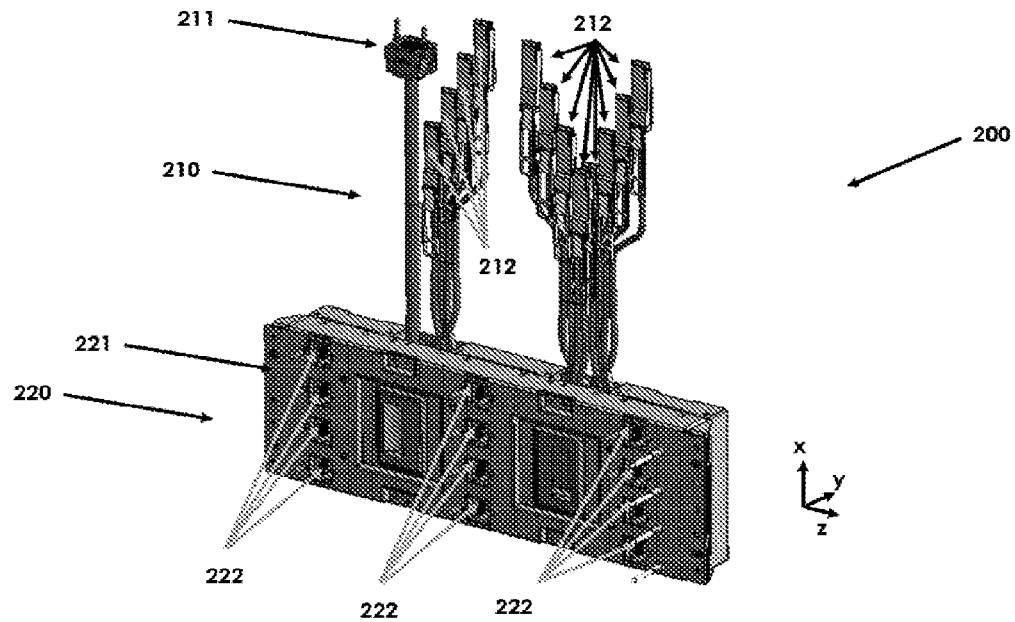
FIG. 5 represents a modular computer cabinet according to a first embodiment of the invention.

FIG. 5 schematically represents an interchangeable interconnection device 200 according to a first embodiment of the invention.

The interconnection device 200 represented in FIG. 5 comprises, according to a first embodiment of the invention, several cables 210 as well as a box 220. The box 220 comprises a connection wall 221.

The connection wall 221 comprises a plurality of connectors 222. The connectors 222 are connectors configured to be blindly connectable, also called backplane connectors. "Blindly connectable" is taken to mean a connector comprising self-alignment means, that is to say that a connector of this type guides itself automatically into the correct coupling position. Thus, an operator making the connection between two blindly connectable connectors does not need to have a view of these two connectors to make the connection.

Preferentially, the connectors 222 are connectors enabling data transfer at high data transfer rate, for example at 25 Gigabits per second or at 56 Gigabits per second, and with low insertion loss. The blindly connectable connectors 222 may for example be STRADA Whisper® connectors.

The connection wall 221 extends along the plane formed by the vertical x and longitudinal z axes represented in FIG. 5.

The connection wall 221 comprises for example 12 blindly connectable connectors 222.

Each blindly connectable connector 222 of the connection wall 221 is configured to be blindly connected to another blindly connectable connector, comprised in a rackable element 150 of the modular computer cabinet 100 according to a first embodiment of the invention. A rackable element 150 may comprise several blindly connectable connectors. The connectors 222 of the connection wall 221 are arranged in rows. For example, in FIG. 5, the twelve connectors 222 are arranged in four rows of three connectors 222. Each of the four rows is intended to be connected to a single rackable element 150. Thus, the three blindly connectable connectors 222 of the first row are intended to be connected to three blindly connectable connectors of a same rackable element 150. Each of these three connectors may for example be used to address a compute node in the case where the rackable element 150 is a compute blade comprising three compute nodes.

The interchangeable interconnection device 200 according to a first embodiment of the invention represented in FIG. 5 comprises several cables 210. Each cable 210 is connected to one or more blindly connectable connectors 222 on one side of the cable for the connection with a rackable element 150, and to a connector 211 or 212 on the other side of the cable for the connection respectively to an interconnection switch 140 or to an administration switch (not represented). Each cable 210 may have a same fixed length, for example two metres. Each cable 210 may have a length different to the other cables 210, or equal to the length of only a certain number of other cables 210.

For example, as represented in FIG. 5, the interchangeable interconnection device 200 may comprise a same number of cables 210 comprising a connector 212 for connection to an interconnection switch 140 as blindly connectable connectors 222. When the connection wall 222 comprises 12 blindly connectable connectors 222 as represented in FIG. 5, the interchangeable interconnection device 200 may comprise 12 cables 210 comprising a connector 212 for connection to an interconnection switch 140.

In an alternative to the first embodiment, the interchangeable interconnection device 200 may only comprise half the cables 210 comprising a connector 212 for connection to an interconnection switch 140 as blindly connectable connectors 222. Thus, the interchangeable interconnection device 200 may only comprise six cables 210 comprising a connector 212 for connection to an interconnection switch 140 in the case where the connection wall 221 comprises twelve blindly connectable connectors 222.

The number of cables 210 comprising a connector 212 for connection to an interconnection switch 140 could be chosen as a function of the number of connectors available at the level of the interconnection switches 140 and the data transfer rate of the cable. For example, six cables 210 could be used with a data transfer rate of 40 Gigabits per second, called 40 G cables, to interconnect twelve compute nodes distributed on four compute blades 150 if these compute nodes only use and/or are only capable of managing a data transfer rate of 20 Gigabits per second.

Twelve cables 210 could also be used having a data transfer rate of 20 Gigabits per second, called 20 G cables, to interconnect twelve compute nodes distributed on four compute blades 150 if these compute nodes use and/or are capable of managing a data transfer rate of 20 Gigabits per second.

To attain such data transfer rates, the connectors 212 for connection to an interconnection switch connector 140 must be capable of managing such data transfer rates. Typically, the connectors 212 used may be QSFP+ (Quad Small Form-factor Pluggable) connectors, enabling a data transfer rate of 40 Gigabits per second on four 10 Gigabits per second InfiniBand® channels or on a single Ethernet 40 Gigabits per second channel. QSFP28 connectors may also used, enabling 4 channels of 28 Gigabits per second, or one 100 Gigabits per second channel.

Thus, the interchangeable interconnection device 200 is called "interchangeable" because it may be disconnected easily from one or more rackable elements 150 and replaced by another interchangeable interconnection device 200 comprising more or less cables 210, with more or less important data transfer rates and/or of which the cables 210 comprise different connectors. This enables flexibility in the configuration of the modular computer cabinet 100 and in the number and the type of rackable elements 150 and interconnection 150 and administration switches mounted in the modular computer cabinet 100. In addition, in the case where a number of rackable elements 150 must be removed from the modular computer cabinet 150, for example for cost reasons, one or more interchangeable interconnection devices 200 may also for their part be removed from the modular computer cabinet 100. During a ramp up for example, it is possible to add rackable elements 150 within the modular computer cabinet 100 and thus to add an interconnection device 200 and if necessary an interconnection switch 140. This makes the modular computer cabinet 100 even more flexible and able to accommodate several types and a different number of rackable elements 150 and interconnection switches 140 throughout the duration for which it will be exploited.

Moreover, as represented in FIG. 5, the interchangeable interconnection device 200 may comprise one or more cables 210 comprising a connector 211 for connection to a connector of an administration switch. Such a cable 210 is also called "Sideband link", making it possible for example to send configuration information to the compute nodes on a channel other than the channels for transmission of computational instructions.

An advantage of cables 210 is that they enable flexibility in the possible configurations, for example to be able to manage to which interconnection switch 140 a compute node of a compute blade 150 is connected. The cables 210 thus enable flexibility in the number of interconnection switches 140 and rackable elements 150 used.

As represented in FIG. 4, the interchangeable interconnection devices 200 are preferentially mounted in the frame of the modular computer cabinet 100 in such a way that the plane in which the connection wall 221 extends is parallel to the front face along arrow A of the modular computer cabinet 100 or to the rear face along arrow B of the modular computer cabinet 100. That is to say that the interchangeable interconnection devices 200 are mounted in vertical position. Thus, the arrangement of the connection wall 221 of the interchangeable interconnection device 200 extending along the vertical x axis in FIG. 4 is orthogonal to each rackable element 150 extending along the y axis, the y axis being the longitudinal axis of the rackable elements 150.

Figure 6:
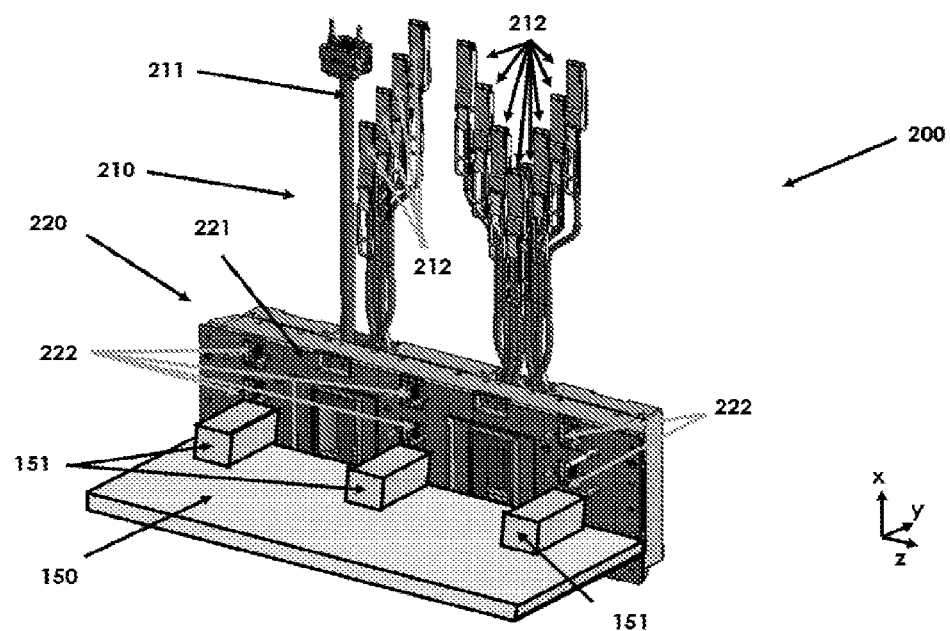
FIG. 6 schematically represents an interchangeable interconnection device connected to a rackable element according to a first embodiment of the invention.

FIG. 6 schematically represents the interchangeable interconnection device 200 connected to a rackable element 150 according to a first embodiment of the invention.

The interchangeable interconnection device 200 according to the first embodiment comprising the connection wall 221 is connected to a rackable element 150, for example a compute blade. "The interchangeable interconnection module 200 is connected to a rackable element 150" is taken to mean the fact that at least one blindly connectable connector 222 of the connection wall 221 is connected to at least one blindly connectable connector 151 of the rackable element 150.

The connection wall 221 extends along a plane orthogonal to the first plane along which the rackable element 150 extends. For example, as represented in FIG. 6, the connection wall 221 of the interchangeable interconnection device 200 extends along the plane formed by the vertical x and longitudinal z axes when the interchangeable interconnection device 200 is mounted in the frame of the modular computer cabinet 100 and when it is connected to at least one rackable element 150.

The rackable element 150 extends along a plane formed by the longitudinal z and transversal y axes when it is mounted in the frame of the modular computer cabinet 100. Thus, when they are connected, the interchangeable interconnection device 200 and in particular the connection wall 221 extends along a plane orthogonal to the plane in which the rackable element 150 extends.

The blindly connectable connector 222 comprising the connection wall 221 of the interchangeable interconnection device 200 is configured to be connected to the blindly connectable connector 151 comprised in the rackable element 150. For example, the blindly connectable connector 151 of the rackable element 150 may be a female connector and the blindly connectable connector 222 of the connection wall 221 may then be a male connector. For example, the blindly connectable connector 151 of the rackable element 150 may be a male connector and the blindly connectable connector 222 of the connection wall 221 may then be a female connector. The two blindly connectable connectors 221 and 151 are blindly connectable connectors, for example STRADA Whisper® connectors or any other type of blindly connectable connector.

The blindly connectable connectors 222 of the interchangeable interconnection device 200 may be arranged for example, as represented in FIG. 5, along several rows, for example four rows. Each row may for example comprise the same number of blindly connectable connectors 222 as blindly connectable connectors 151 comprised in a rackable element 150. This advantageously makes it possible to be able to interconnect several rackable elements 150 to one or more switches with a same interchangeable interconnection device 200.

Figure 7:
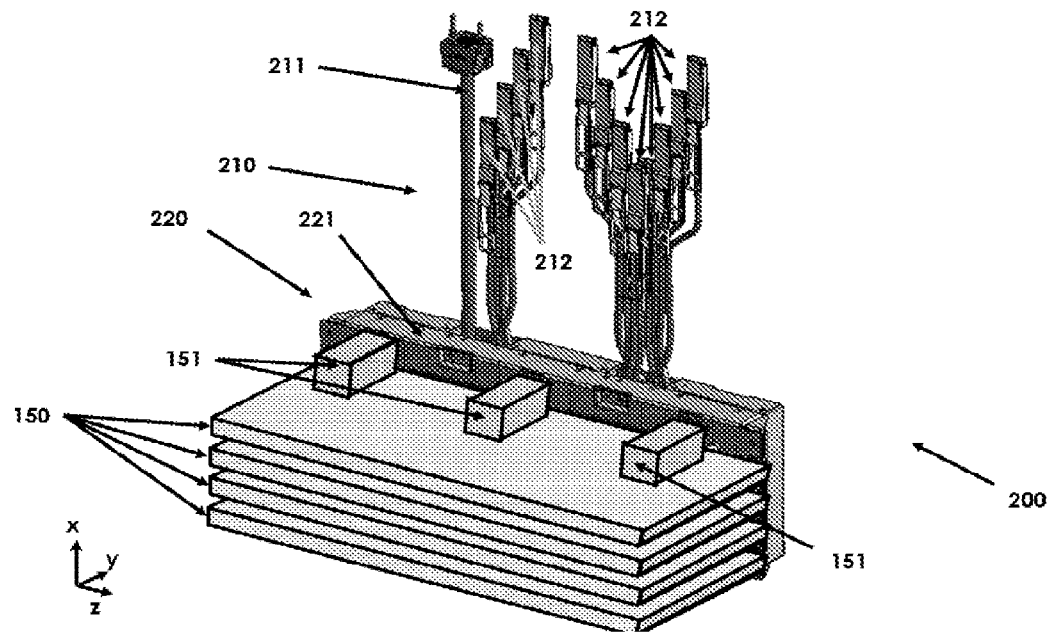
FIG. 7 schematically represents the interchangeable interconnection device connected to several rackable elements according to a first embodiment of the invention.

FIG. 7 schematically represents the interchangeable interconnection device 200 connected to several rackable elements 150 according to a first embodiment of the invention.

Four rackable elements 150 are connected to an interchangeable interconnection device 200 in FIG. 7. Each of the rackable elements 150 is for example connected to the interconnection wall and thus to the interchangeable interconnection device 200 on one of the rows of blindly connectable connectors 222 of the connection wall 221. The interchangeable interconnection device 200 then makes it possible to interconnect a plurality of rackable elements 150 to one or more interconnection 140 and/or administration switches.

As represented in FIG. 4, the interchangeable interconnection devices 200 are preferentially mounted in the frame of the modular computer cabinet 100 in such a way that the plane in which the connection wall 221 extends is parallel to the front face along arrow A of the modular computer cabinet 100 or to the rear face along arrow B of the modular computer cabinet 100 and in such a way that several rackable elements 150 can be mounted in the frame from the rear face of the modular computer cabinet 100 and from the front face of the modular computer cabinet 100. To do so, preferentially, two interchangeable interconnection devices 200 may be back-to-back, that is to say that one of the two interchangeable interconnection devices 200 may have its connection wall 221 and thus the blindly connectable connectors 222 of the connection wall 221 turned towards the front face and making it possible to interconnect one or more rackable elements 150 mounted through the front face of the modular computer cabinet 100 with one or more interconnection 140 and/or administration switches while having the other interchangeable interconnection devices 200 of the two interchangeable interconnection devices 200 with its connection wall 221 and thus the blindly connectable connectors 222 of the connection wall 221 turned towards the rear face and making it possible to interconnect one or more rackable elements 150 mounted through the rear face of the modular computer cabinet 100 with one or more interconnection 140 and/or administration switches.

In the back-to-back configuration, it is preferable that the interchangeable interconnection devices 200 are centred in the modular computer cabinet 100 as represented in FIG. 4. "Centred" is taken to mean the fact that the back of each of the boxes 220 in a "back-to-back" arrangement is substantially in the median plane of the modular computer cabinet 100, that is to say substantially in the plane along the median axis 300 of FIG. 4. It is then possible to have rackable elements 150 on the front face and on the rear face of the modular computer cabinet 100, because the interchangeable interconnection devices 200 are at the centre of the modular computer cabinet 100.

Thus, it is easy for an operator for example to interconnect a flexible number of rackable elements 150 with a flexible number of interconnection switches 140 and/or administration switches. Indeed, thanks to the interchangeable interconnection devices 200, an operator does not need to have access to the rear of the rackable elements 150 to interconnect them with one or more interconnection switches 140.

Thanks to the invention, an operator only has to mount the interchangeable interconnection devices 200 within the modular computer cabinet 100, to mount in the frame the rackable elements, by sliding them in the "racks" for example and by blindly connecting the blindly connectable connectors 151 of each rackable element 150 with the blindly connectable connectors 222 of the connection wall 221 and finally by connecting each of the connectors 211 and 212 of the cables 210 of the interchangeable interconnection device to a connector of one or more interconnection switches 140 and/or one or more administration switches according to the desired topology and according to the desired number of rackable elements 150.

The invention thus makes it possible not to need to have access to the rear of the rackable elements 150, to have a flexible number of rackable elements 150 and switches, and to be able to choose a topology, without having to make all the connections to the rackable elements by hand.

Figure 8:
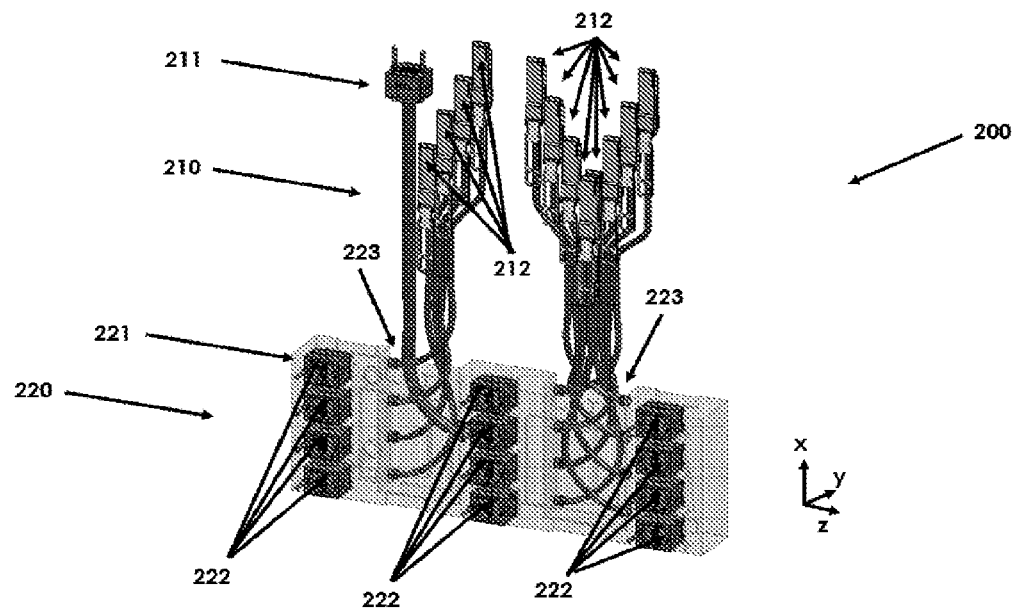
FIG. 8 schematically represents an interchangeable interconnection device of which the box is in transparency view according to a first embodiment of the invention.

FIG. 8 schematically represents the interchangeable interconnection device 200 of which the box 220 is in transparency view according to a first embodiment of the invention.

The interchangeable interconnection device 200 may further comprise one or more holes 223 to allow the cables 210 to pass, the cables 210 being connected to the blindly connectable connectors 222 of the connection wall 221. These holes may for example be grooves, as represented in FIG. 8. Thus, according to the invention, when two or more interchangeable interconnection devices 200 are one above the other or others along the vertical x axis of the modular computer cabinet 100 as represented in FIG. 4, the cables of the interchangeable interconnection device 200 situated below along the vertical x axis of the other interchangeable interconnection device(s) 200 can pass into the hole of the interchangeable interconnection device(s) 200 situated there above to reach the interconnection switch(es) 240 and/or the administration switch(es).

What is claimed is:

1. A modular computer cabinet configured to accommodate:
   a plurality of rackable elements, each rackable element of the plurality of rackable elements extending along a first plane and comprising at least one first blindly connectable connector;
   at least one interconnection switch comprising a plurality of second connectors;
   wherein the plurality of rackable elements and the at least one interconnection switch are mounted on at least one frame of the modular computer cabinet, wherein mounting of the plurality of rackable elements is done through a front face and/or through a rear face of the modular computer cabinet, wherein:
   the modular computer cabinet comprises at least one interchangeable interconnection device configured to interconnect the at least one interconnection switch with the plurality of rackable elements, said at least one interchangeable interconnection device comprising:
- a connection wall for connecting to the plurality of rackable elements, said connection wall extending along a second plane orthogonal to the first plane of the plurality of rackable elements, said connection wall comprising a plurality of third blindly connectable connectors, each of the plurality of third blindly connectable connectors being configured to be blindly connected to at least the at least one first blindly connectable connector of one of the plurality of rackable elements,
- at least one interconnection cable connected to at least one third connector of the plurality of third blindly connectable connectors of the connection wall, said at least one interconnection cable comprising at least one fourth connector configured to be connected to at least one second connector of the plurality of second connectors comprised in the at least one interconnection switch,
- a box, the box comprising at least the connection wall.

2. The modular computer cabinet according to claim 1, wherein the at least one interchangeable interconnection device is configured to be mounted substantially along a median plane separating the modular computer cabinet into two, the median plane being parallel to the front face of the modular computer cabinet.

3. The modular computer cabinet according to claim 1, wherein the at least one interchangeable interconnection device comprises at least one hole configured to allow the at least one interconnection cable to pass vertically.

4. The modular computer cabinet according to claim 1, wherein at least one rackable element of the plurality of rackable elements is a compute blade comprising a plurality of nodes and a same number of first connectors as compute nodes.

5. The modular computer cabinet according to claim 1, wherein the modular computer cabinet comprises a plurality of interchangeable interconnection devices.

6. The modular computer cabinet according to claim 1, wherein at least one rackable element of the plurality of rackable elements is mounted on the front face of the modular computer cabinet and at least one rackable element of the plurality of rackable elements is mounted on the rear face of the modular computer cabinet.

7. The modular computer cabinet according to claim 1, comprising at least two interchangeable interconnection devices arranged back-to-back.

8. The modular computer cabinet according to claim 1, wherein the at least one interconnection cable has a maximum data transfer rate of 20 Gigabits per second.

9. The modular computer cabinet according to claim 1, wherein the at least one interconnection cable has a maximum data transfer rate of 40 Gigabits per second.

* * * * *